(12) United States Patent
Hurwitt et al.

(10) Patent No.: US 6,183,523 B1
(45) Date of Patent: *Feb. 6, 2001

(54) APPARATUS FOR THERMAL CONTROL OF VARIOUSLY SIZED ARTICLES IN VACUUM

(75) Inventors: Steven Hurwitt, deceased, late of Park Ridge, NJ (US), by Anne Hurwitt, executrix; Ira Reiss, New City, NY (US)

(73) Assignee: Tokyo Electron Limited, Tokyo (JP)

(*) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/810,359

(22) Filed: Mar. 3, 1997

(51) Int. Cl.[7] .......................... H01L 21/00; H01L 21/64; H01J 3/26; H01J 3/14
(52) U.S. Cl. .................... 29/25.01; 250/398; 118/725; 118/728
(58) Field of Search .............. 29/25.01; 250/398; 118/725, 728

(56) References Cited

U.S. PATENT DOCUMENTS

| | | | |
|---|---|---|---|
| 4,261,762 | 4/1981 | King | 148/1.5 |
| 4,457,359 | 7/1984 | Holden | 165/80 |
| 4,512,391 | 4/1985 | Harra | 165/48 R |
| 4,542,298 | 9/1985 | Holden | 250/443.1 |
| 4,680,061 | 7/1987 | Lamont, Jr. | 148/1.5 |
| 4,705,951 | * 11/1987 | Layman et al. | |
| 4,743,570 | 5/1988 | Lamont, Jr. | 437/248 |
| 4,909,314 | 3/1990 | Lamont, Jr. | 165/80.3 |
| 4,949,783 | 8/1990 | Lakios et al. | 165/80.1 |
| 5,001,423 | * 3/1991 | Abrami et al. | |
| 5,583,737 | * 12/1996 | Collins et al. | |

* cited by examiner

Primary Examiner—David E. Graybill
(74) Attorney, Agent, or Firm—Wood, Herron & Evans, L.L.P.

(57) ABSTRACT

A substrate support platform has a substrate engaging surface which defines a first channel for introducing and distributing a thermal transfer gas to a first region of the engaging surface, and a second channel, nonintersecting with the first channel, for introducing and distributing a thermal transfer gas to a second region of the engaging surface. A gas delivery system is independently connected between a gas source and the first and second channels, for independently providing (via valved connections) a thermal transfer gas to the first and second channels, so that gas delivery may be limited to one of the channels, or gas may be delivered to both of the channels in case a substrate is placed over either or both of the associated regions. A pressure measuring device is independently coupled to each of the channels via measuring ports, permitting measurement and control of gas pressure from the gas source.

19 Claims, 4 Drawing Sheets

APPARATUS FOR THERMAL CONTROL OF VARIOUSLY SIZED ARTICLES IN VACUUM

FIELD OF THE INVENTION

This invention relates to the transfer of heat to and from generally flat articles in a vacuum or low pressure environment by means of a thin layer of gas.

BACKGROUND OF THE INVENTION

An article in a vacuum or low pressure environment is generally thermally isolated from its surroundings. Even if placed on or clamped to a support surface, only a limited number of microscopic points of actual thermal contact exist between the article and the support surface. In order to improve both the effectiveness and uniformity of thermal contact, it is known technique to introduce a thin layer of heat conveying gas between the article and the support surface.

This technique is frequently used in the deposition by sputtering or etching of thin films on silicon, ceramic or glass substrates. In these processes, it is sometimes desired to maintain a substrate at a low temperature in spite of heat generated by the sputter deposition or etching processes. In such cases, the thin layer of the heat conveying gas is used to transfer heat from the substrate to the support platform. The support platform is then cooled with suitable cooling means.

Alternatively, in sputtering processes, it is sometimes desired to maintain a substrate at a temperature higher than it would normally reach from the heat generated by the sputter deposition alone. In this case, the heat conveying gas film transfers heat from a support platform containing heating means to the substrate.

The same support platform may contain both cooling and heating means so that heat may be transferred either from or to a substrate as required.

The technique of thermally controlling a substrate by means of a heat conveying gas layer is disclosed in the following U.S. Pat. Nos.: 4,261,762, 4,457,359; 4,512,391; 4,542,298; 4,680,061; 4,743,570; 4,909,314 and 4,949,783.

A typical embodiment of this art is shown in FIG. 1. which is a section view through substrate and support platform and in FIG. 2 which is a plan view of the support platform surface.

A substrate 1 is placed on the engaging surface 2 of a support platform 3 which may contain cooling means 4 and heating means 5. Flange 6 and seal 7 connect the apparatus to processing chamber wall 8, providing for a vacuum or low pressure environment 9 around substrate 1 by sealing out an atmospheric environment 10 on the opposite side of plate 3.

A heat conveying gas, such as argon or helium, is introduced through port 11 and is distributed by channel 12. Port 13 is used to measure the pressure of the heat conveying gas, which may be adjusted to approximately 10 Torr in order to provide effective thermal transfer between substrate 1 and support platform 3.

Holding means 14, which may be a plurality of individual fingers or may be a continuous ring, retain substrate 1 against the force of the heat conveying gas pressure and maintain a close fit between substrate 1 and engaging surface 2. Because some heat conveying gas may escape in direction 15 at the perimeter 16 of substrate 1, thereby reducing gas pressure and thermal transfer, it is desirable that the gap between substrate 1 and engaging surface 2 is 0.003 or less.

In embodiments where heating means 5 are not used, a soft rubber seal may be placed near perimeter 16 to further reduce gas loss, but such seals are generally not used at elevated temperatures due to degradation of the seal material.

In order to maximize the area of thermal transfer between substrate 1 and support platform 3, the outermost portion 17 of gas distribution channel 12 is generally configured to conform closely to perimeter 16 of substrate 1, thus limiting the use of a particular support platform to substrates of a specific shape and size for which the support platform was constructed.

SUMMARY OF THE INVENTION

In some applications, it may be desired to process substrates of different sizes. Unfortunately, the prior art configuration requires that the support platform 3 be replaced with each substrate size change.

Therefore, it is an object of this invention to provide a gas thermal transfer support platform which accommodates substrates of more than one size or shape avoiding the need for replacing the support platform.

It is a further object of this invention to provide a gas thermal transfer support platform which accommodates a plurality of substrates at one time.

In accordance with principles of the present invention, these objects are achieved by a substrate support platform having a substrate engaging surface which defines a first channel for introducing and distributing a thermal transfer gas to a first region of the engaging surface, and a second channel, nonintersecting with the first channel, for introducing and distributing a thermal transfer gas to a second region of the engaging surface.

In specific embodiments, a gas delivery system is independently connected between a gas source and the first and second channels, for independently providing (via valved connections) a thermal transfer gas to the first and second channels, whereby gas delivery may be limited to one of the channels, or gas may be delivered to both of the channels in case a substrate is placed over either or both of the associated regions.

In addition, a pressure measuring device, for measuring a gas pressure, is independently coupled to each of the channels via measuring ports, permitting measurement and control of gas pressure from the gas source.

The second channel may be nested within the first channel, such that the first region encompasses the second region. In this embodiment, a smaller substrate can be placed over the second channel, and gas can be delivered to the second channel only, to effect thermal transfer between the support platform and the smaller substrate. Alternatively, a larger substrate can be placed over the first channel and second channel, and gas may be delivered to the first channel and the second channel to effect thermal transfer between the support platform and the larger substrate.

In an alternative embodiment, the first and second channels are not nested in this manner, so that the first and second regions are nonoverlapping. In this embodiment, substrates may be selectively placed on the first channel and/or the second channel, and gas delivered only to the channel(s) which have a substrate placed thereon.

In any of these embodiments, the channels may be circular, square, or any other shape, in any combination. The regions served by the channels may be of similar shapes and sizes or different shapes and sizes.

In further embodiments, third or further nonintersecting channels may be formed on the substrate support platform to provide additional regions to which gas may be provided to thermally control substrates.

In further aspects, the invention features a semiconductor processing chamber incorporating the novel wafer support surface, and methods of using the wafer support surface.

The benefits and advantages of the invention over the prior art apparatus and methods will become more readily apparent from the description of the drawings and detailed description which follow.

The accompanying drawings, which are incorporated in and constitute a part of this specification, illustrate embodiments of the invention, and together with a general description of the invention given above, and the detailed description of the embodiments given below, serve to explain the principles of the invention.

DETAILED DESCRIPTION OF SPECIFIC EMBODIMENTS

Figure 1:
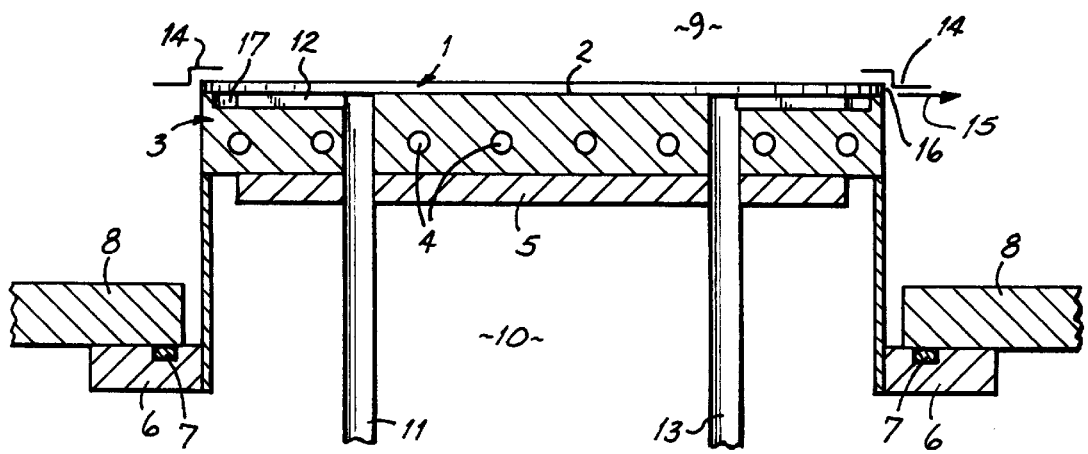
FIG. 1 is a cross-sectional view of a support platform in accordance with the prior art.
Figure 2:
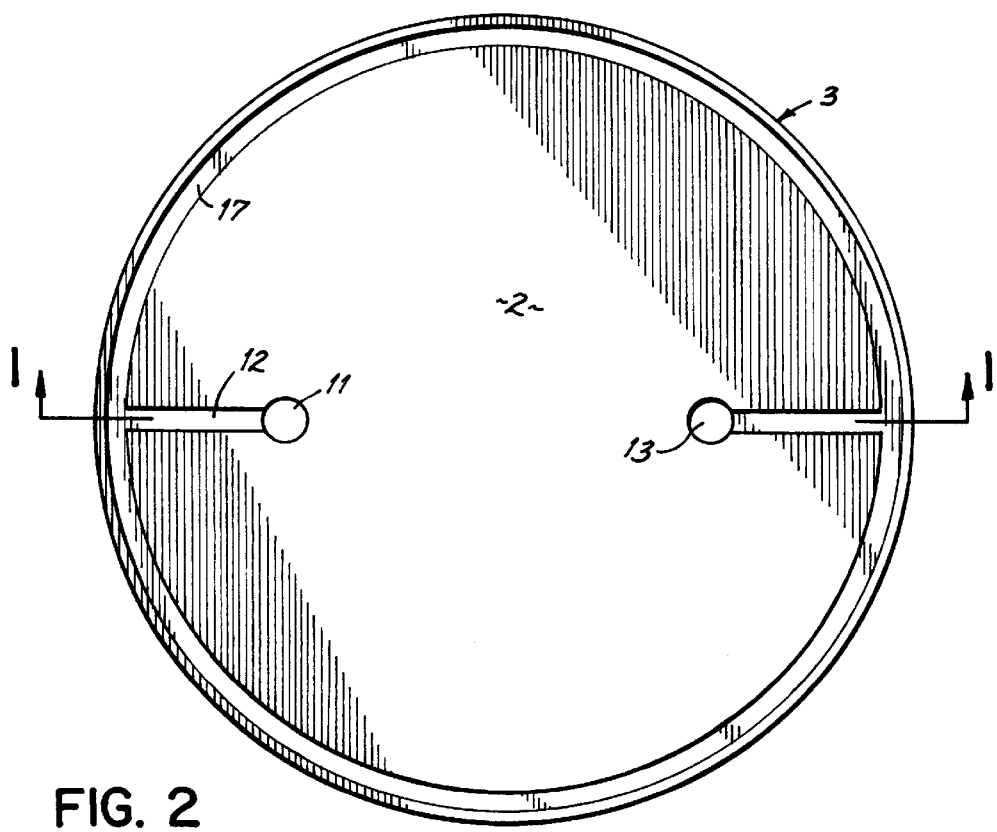
FIG. 2 is a plan view of the upper surface of the platform of FIG. 1 without the substrate and holding means.
Figure 3:
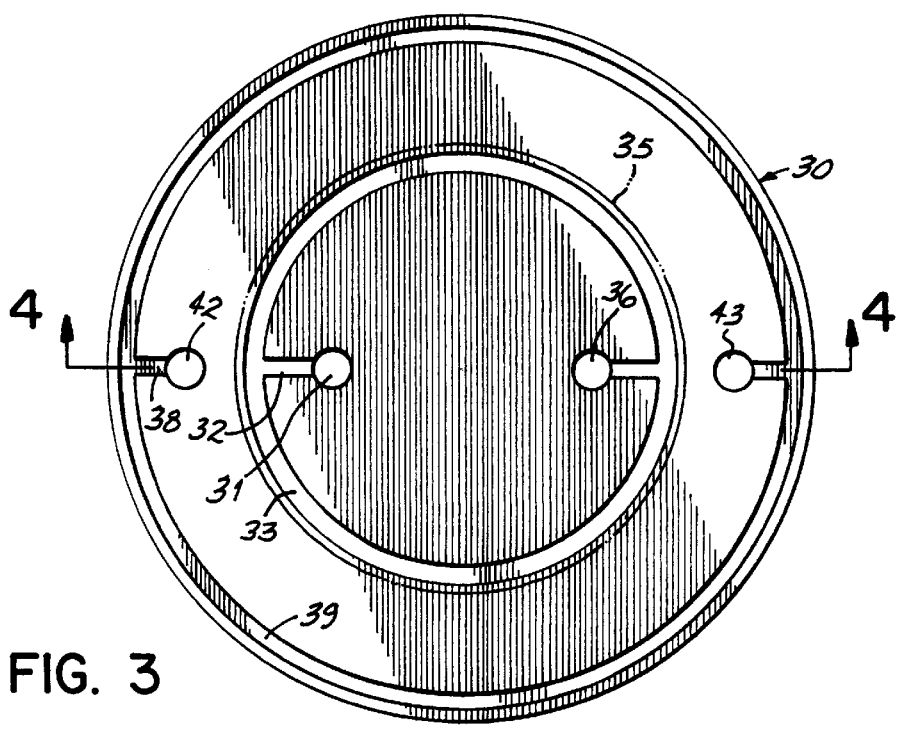
FIG. 3 is a plan view of the upper surface of a support platform in accordance with a first embodiment of the present invention.
Figure 4:
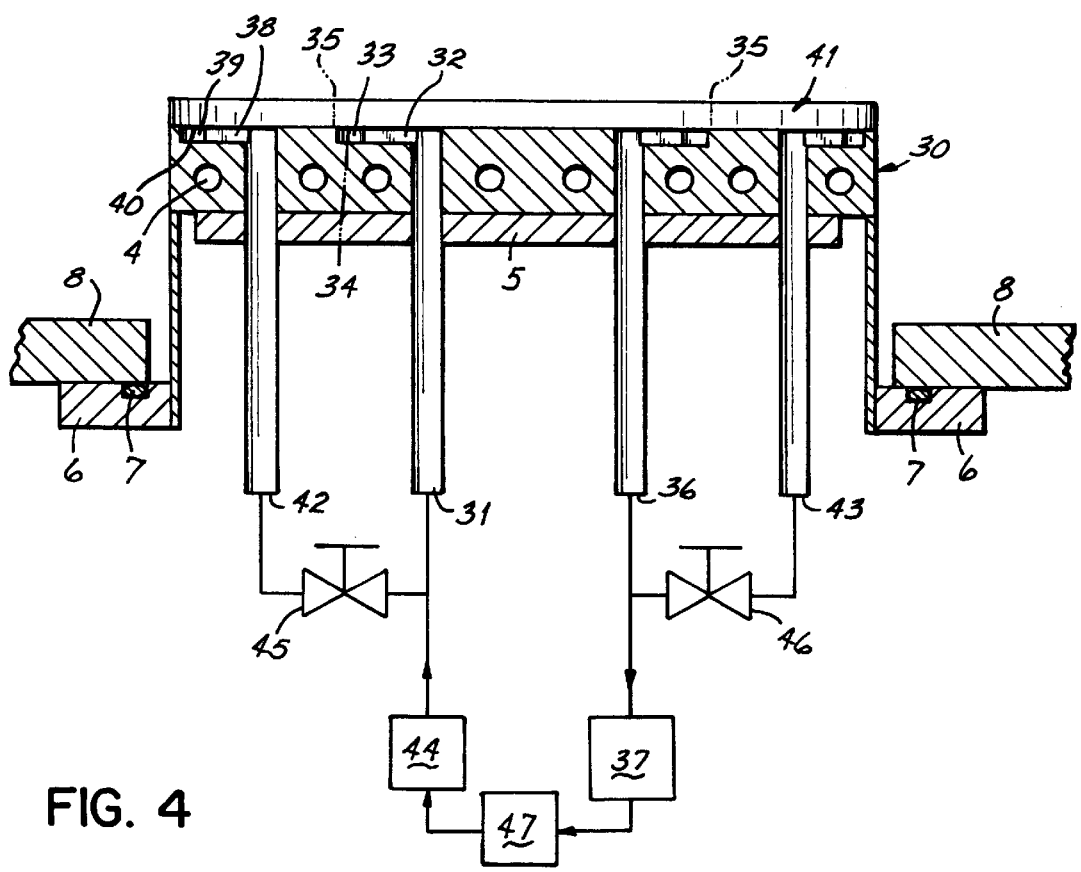
FIG. 4 is a partly schematic cross-sectional view of the support platform of FIG. 3 and gas distribution valves and channel connections therefor with a substrate positioned thereon.

A first embodiment which addresses the accommodation of single substrates of varying sizes is shown in FIGS. 3 and 4. Support platform 30 is equipped with a gas inlet port 31 and distribution channel 32. The outermost portion 33 of channel 32 is sized to engage the peripheral surface 34 of a smaller substrate such as having an outer perimeter as shown at 35. Port 36 provides for measurement of the heat conveying gas pressure by pressure transducer 37. Heat conveying gas from a source passes through pressure control valve 44 is admitted through port 31 into channels 32, 33. Pressure control valve 44 is controlled by a pressure controller 47, which is responsive to pressure measurements from transducer 37.

Support platform 30 is also equipped with an independent gas inlet port 42 and gas distribution channel 38, with outermost portion 39 sized to engage the peripheral surface 40 of larger substrate 41 (FIG. 4). Channel 38 is connected to second gas inlet port 42. An independent pressure measurement port 43 may also be provided.

When used with smaller substrate as shown at 35, valve 45 is closed to prevent loss of gas through unused channels 38, 39. Valve 46 is also closed to isolate pressure transducer 37 from unused channels 38, 39 and the interior of the vacuum chamber. In this way, heat conveying gas is distributed only inside of the peripheral surface 34 of smaller substrate 35.

When used with larger substrate 41 (FIG. 4), valve 45 is opened, admitting heat conveying gas from the source through pressure control valve 44 to both inner channels 32, 33 and outer channels 38, 39. Valve 46, if provided, is also opened to permit measurement of gas pressure through port 43 if provided. Valve 46 and port 43 are not required, but permit a more accurate measurement of gas pressure behind larger substrate 41. With valve 45 open, heat conveying gas is distributed everywhere inside of the peripheral surface 40 of larger substrate 41. Both cooling means 4 and heating means 5 may be provided with support platform 30.

Within the scope of this invention, the number of independent gas distribution channels is not limited to two. A plurality of three or more concentric or otherwise nested channels may be included in a support platform to provide for processing of a plurality of substrate sizes.

Figure 5:
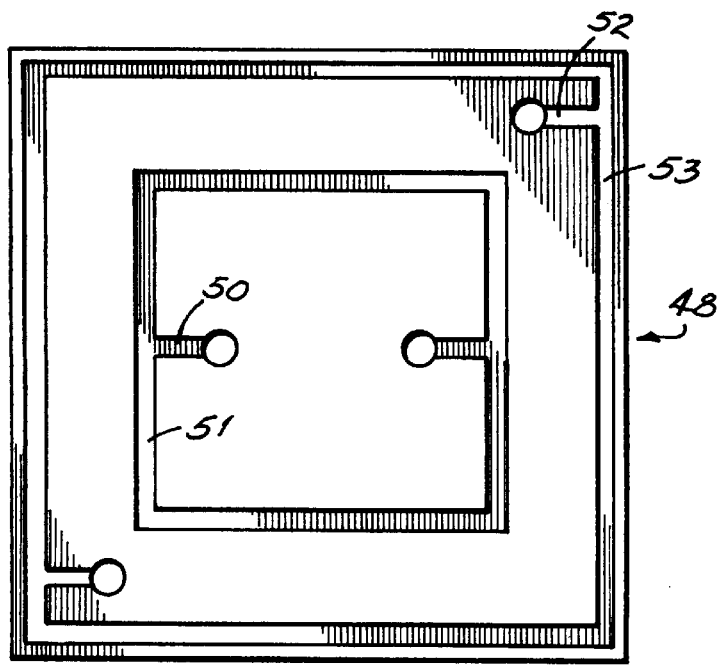
FIG. 5 is a plan view of the upper surface of a support platform in accordance with a second embodiment of the present invention useful with square substrates.
Figure 6:
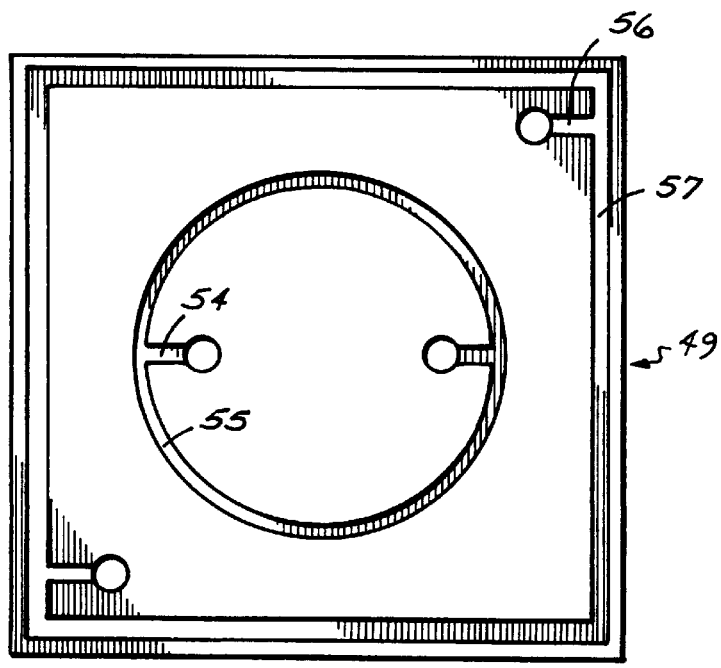
FIG. 6 is a plan view of the upper surface of a support platform in accordance with a third embodiment of the present invention useful with smaller round or larger square substrates.

Principles of the present invention are also not limited to use with circular substrates. FIG. 5 shows a support platform 48 with inner channels 50, 51 and outer channels 52, 53 configured for square substrates. FIG. 6 shows a support platform 49 of inner channels 54, 55 and outer channels 56, 57 for a combination of small circular and larger square substrates.

While FIG. 6 illustrates circular inner channels 54, 55 nested inside of square outer channels 56, 57, it will be understood that other arrangements of circular, square or otherwise shaped channels may be combined in a nested arrangement without departure from the principles of the present invention.

Figure 7:
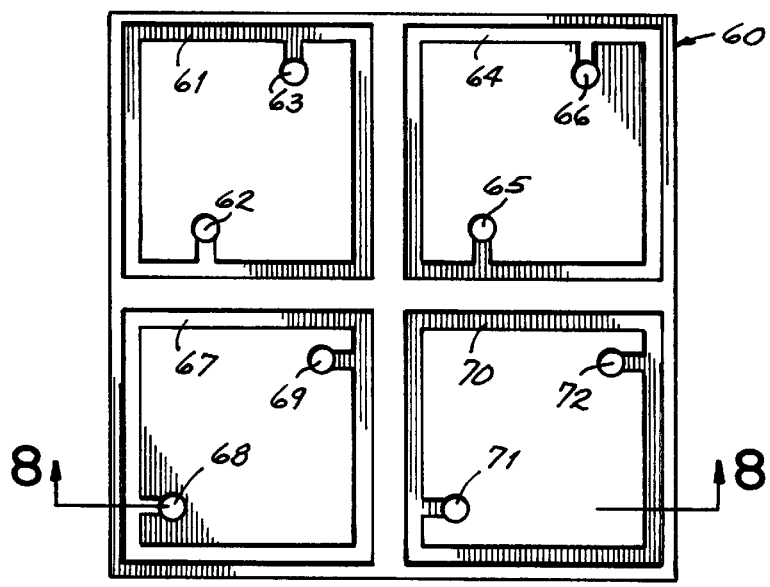
FIG. 7 is a plan view of the upper surface of a support platform in accordance with a fourth embodiment of the present invention useful in processing multiple substrates simultaneously; and, FIG. 8 is a schematic diagram of gas distribution valves and channel connections for the support platform of FIG. 7.

A further embodiment of this invention is particularly suited for use in the treatment of a plurality of substrates at one time. Referring to FIG. 7, a multi-substrate support platform 60 contains gas distribution channels 61, 64, 67, and 70 which are connected to inlet ports 62, 65, 68, and 71 in a manner similar to that shown in FIG. 4 so that any combination of channels may be independently activated by admission of gas from one or more sources. Similarly, ports 63, 66, 69, and 72 are independently valved to one or more pressure measuring devices.

Figure 8:
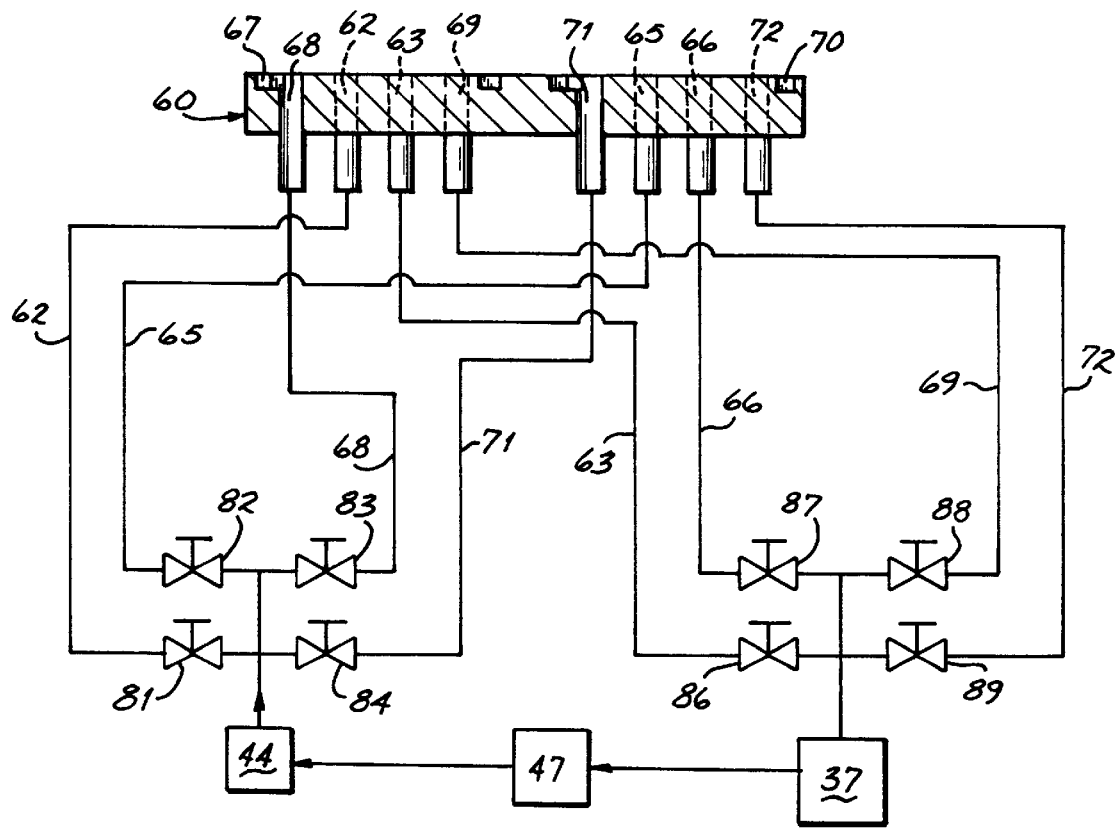

Specifically, referring to FIG. 8, in one embodiment, each of inner ports 62, 65, 68 and 71 are connected via respective valves 81, 82, 83 and 84 to the source of heat conveying gas through pressure control valve 44. If a substrate is not placed over one of ports 62, 65, 68 and/or 71 during a given process step, the respective valve(s) 81, 82, 83 and/or 84 is (are) shut off for that process step. Similarly, ports 63, 66, 69 and 72 are connected to a common pressure transducer 37, via respective valves 86, 87, 88 and 89. Here again, if a substrate is not placed over one of the ports 62, 65, 68 and/or 71 during a given process step, the respective valve(s) 86, 87, 88 and/or 89 is (are) shut off for that process step.

It will be appreciated that while one gas source and one pressure measuring device are shown in FIG. 8, multiple sources or devices might be used, with or without common flow paths from one or more sources or devices to one or more channels.

It will further be appreciated that if support platform 60 will always be used with a full complement of substrates, then valving may be eliminated, with inlet ports 62, 65, 68 and 71 permanently connected together to a single gas source via a single valve, and with pressure measurement ports 63, 66, 69 and 72 permanently connected together and to a single pressure measurement device via a single valve.

Substrates may be retained to platform 60 by individual means associated with each substrate or by a common device which retains a plurality of substrates.

It will be appreciated that platform 60 may be constructed with channels to accommodate plural substrates of similar size and shape such as is illustrated in FIG. 7, or platform 60 may be constructed with channels to accommodate substrates of mixed sizes and shapes. Furthermore, nested sets of channels, similar to those shown in FIGS. 3–6, may be included to accommodate multiple substrate sizes in a single location.

In one particular embodiment of the invention, pressure controller 47, pressure control valve 44 and pressure transducer 37 may be components available from MKS Instruments, Inc. of Andover, Mass., as model nos. 250C-1-A, 0248A-00050RV and 626A12TBE, respectively. Isolation valves 45, 46, 81, 82, 83, 84, 86, 87, 88 and 89 may be obtained from NUPRO Co. of Willoughby, Ohio as model number SS-BNV51-C.

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. The invention in its broader aspects is therefore not limited to the specific details, representative apparatus and method, and illustrative example shown and described. Accordingly, departures may be made from such details without departing from the spirit or scope of applicant's general inventive concept.

What is claimed is:

1. A substrate support platform for thermal control of a generally flat substrate in an evacuated environment by delivery of a gas from a gas source to a region between said substrate and said substrate support platform, comprising:
    a substrate engaging surface,
    a holder arranged to retain a substrate adjacent said engaging surface,
    a first channel in said engaging surface for introducing a thermal transfer gas to a first region of said engaging surface and distributing said gas within said first region when a substrate is retained adjacent said engaging surface, said first region including that part of the surface of said substrate engaging surface surrounded by said first channel or surrounded by any opening or channel in said substrate engaging surface connected to said first channel through a gas flow connection in said substrate support platform,
    a second channel in said engaging surface for introducing a thermal transfer gas to a second region of said engaging surface and distributing said gas within said second region when a substrate is retained adjacent said engaging surface, said second region including that part of the surface of said substrate engaging surface surrounded by said second channel or surrounded by any opening or channel in said substrate engaging surface connected to said second channel through a gas flow connection in said substrate support platform,
    wherein there is no gas flow connection between said channels through said substrate support platform, and no gas flow connection between said first channel and any part of said second region through substrate support platform.

2. The substrate support platform of claim 1 further comprising a gas delivery system connected between said gas source and said first and second channels for providing a thermal transfer gas to said first and second channels, said gas delivery system including a valve coupled between said gas source and said first channel for selectively preventing gas flow to said first channel, whereby gas delivery may be limited to said second channel.

3. The substrate support platform of claim 2 wherein said gas delivery system further includes a valve coupled between said gas source and said second channel for selectively preventing gas flow to said second channel, whereby gas may be selectively delivered to said first and/or second channels.

4. The substrate support platform of claim 1 further comprising a third channel in said engaging surface for introducing a thermal transfer gas to a third region of said engaging surface and distributing said gas within said second region when a substrate is retained adjacent said engaging surface, said first, second and third channels being nonintersecting.

5. The substrate support platform of claim 4 further comprising a gas delivery system connected between said gas source and said first and second channels for providing a thermal transfer gas to said first, second and third channels, said gas delivery system including a valve coupled between said gas source and said first channel and a second valve coupled between said gas source and said second channel for selectively preventing gas flow to said first and second channels, whereby gas delivery may be limited to said third channel.

6. The substrate support platform of claim 5 wherein said gas delivery system further includes a third valve coupled between said gas source and said third channel for selectively preventing gas flow to said third channel, whereby gas may be selectively delivered to said first, second and/or third channels.

7. The substrate support platform of claim 1 wherein said second channel is wholly encompassed passed within said first region, such that said first region encompasses said second region, whereby gas may be delivered to said second channel to effect thermal transfer between said support platform and a first substrate positioned upon and covering the entirety of said first region, and gas may be delivered to said first channel and said second channel to effect thermal transfer between said support platform and a second substrate positioned upon and covering the entirety of said first region.

8. The substrate support platform of claim 7 wherein said second channel is circular.

9. The substrate support platform of claim 8 wherein said first channel is square.

10. The substrate support platform of claim 7 wherein said first channel is circular.

11. The substrate support platform of claim 10 wherein said second channel is square.

12. The substrate support platform of claim 7 further comprising a third channel in said engaging surface for introducing a thermal transfer gas to a third region of said engaging surface and distributing said gas within said third region when a substrate is retained adjacent said engaging surface, said third region including that part of the surface of said substrate engaging surface surrounded by said third channel or surrounded by any opening or channel in said substrate engaging surface connected to said third channel through a flow connection in said substrate platform, said first, second and third channels being nonintersecting.

13. The substrate support platform of claim 12 wherein said third channel is wholly encompassed within said second region, such that said first and second regions encompass said third region.

14. The substrate support platform of claim 1 further comprising a third channel in said engaging surface for introducing a thermal transfer gas to a third region of said engaging surface and distributing said gas within said third region when a substrate is retained adjacent said engaging surface, said first, second and third channels being nonintersecting.

15. The substrate support platform of claim 1 further comprising a gas delivery system connected between said gas source and said first and second channels for providing a thermal transfer gas to said first and second channels, wherein said second channel is positioned on said substrate support platform wholly outside of said first channel, such that said first region and said second region are nonoverlapping, and said gas delivery system includes a valve coupled between said gas source and said first channel for selectively preventing gas flow to said first channel, whereby gas delivery may be limited to said second channel.

16. The substrate support platform of claim 15 wherein said gas delivery system further includes a valve coupled between said gas source and said second channel for selectively preventing gas flow to said second channel, whereby gas may be selectively delivered to said first and/or second channels.

17. The substrate support platform of claim 1 further comprising a pressure measuring device for measuring a gas pressure, wherein said substrate support platform further comprises a measuring port formed in said support platform within said first region of said engaging surface, said pressure measuring device being connected to said measuring port for measuring gas pressure in said first region.

18. The substrate support platform of claim 17 wherein said substrate support platform further comprises a second measuring port formed in said support platform within said second region of said engaging surface, further comprising a valve coupled between said second measuring port and said pressure measuring device, whereby pressure measuring device may be selectively connected to said first or second ports to respectively measure pressure in said first or second regions.

19. A semiconductor processing apparatus for surface processing of a semiconductor substrate, comprising a vacuum chamber for maintaining a evacuated environment for surface processing of a substrate, and a substrate support platform for supporting said substrate within said vacuum chamber, said substrate support platform being configured for thermal control of said substrate by delivery of a gas from a gas source to a region between said substrate and said substrate support platform, and comprising:

a substrate engaging surface, a holder arranged to retain a substrate adjacent said engaging surface, a first channel in said engaging surface for introducing a thermal transfer gas to a first region of said engaging surface and distributing said gas within said first region when a substrate is retained adjacent said engaging surface, said first region including that part of the surface of said substrate engaging surface surrounded by said first channel or surrounded by any opening or channel in said substrate engaging surface connected to said first channel through a gas flow connection in said substrate support platform, a second channel in said engaging surface for introducing a thermal transfer gas to a second region of said engaging surface and distributing said gas within said second region when a substrate is retained adjacent said engaging surface, said second region including that part of the surface of said substrate engaging surface surrounded by said second channel or surrounded by any opening or channel in said substrate engaging surface connected to said second channel through a gas flow connection in said substrate support platform, wherein there is no gas flow connection between said channels through said substrate support platform, and no gas flow connection between said first channel and any part of said second region through said substrate support platform.

* * * * *

UNITED STATES PATENT AND TRADEMARK OFFICE
CERTIFICATE OF CORRECTION

PATENT NO.      : 6,183,523 B1  
DATED           : February 6, 2001  
INVENTOR(S)     : Hurwitt et al.

Page 1 of 1

It is certified that error appears in the above-identified patent and that said Letters Patent is hereby corrected as shown below:

<u>Column 6,</u>
Line 39, reads "encompassed passed within" and should read -- encompassed within --.
Line 44, reads "said first region" and should read -- said second region but not covering the entirety of said first region --.

Signed and Sealed this

Second Day of April, 2002

Attest:

JAMES E. ROGAN
Attesting Officer         Director of the United States Patent and Trademark Office